US009652569B2

(12) United States Patent
Dogan

(10) Patent No.: US 9,652,569 B2
(45) Date of Patent: May 16, 2017

(54) NANOSTRUCTURED DIELECTRIC MATERIALS FOR HIGH ENERGY DENSITY MULTI LAYER CERAMIC CAPACITORS

(75) Inventor: Fatih Dogan, Rolla, MO (US)

(73) Assignee: The Curators of the University of Missouri, Columbia, MO (US)

( * ) Notice: Subject to any disclaimer, the term of this patent is extended or adjusted under 35 U.S.C. 154(b) by 541 days.

(21) Appl. No.: 13/423,579

(22) Filed: Mar. 19, 2012

(65) Prior Publication Data

US 2013/0037998 A1    Feb. 14, 2013

Related U.S. Application Data

(62) Division of application No. 12/550,373, filed on Aug. 29, 2009, now Pat. No. 8,263,515.

(51) Int. Cl.
| | | |
|---|---|---|
| *C04B 35/10* | (2006.01) | |
| *C04B 35/48* | (2006.01) | |
| *C04B 35/46* | (2006.01) | |
| *G06F 17/50* | (2006.01) | |

(52) U.S. Cl.
CPC .................................. *G06F 17/504* (2013.01)

(58) Field of Classification Search
CPC ............ B29C 67/0077; B29C 67/0074; G03G 15/224
USPC .................. 264/614, 648, 603, 681
See application file for complete search history.

(56) References Cited

U.S. PATENT DOCUMENTS

| 4,192,840 A | * | 3/1980 | Schmelz | ............. | H01G 4/1281 |
| | | | | | 252/520.21 |
| 5,757,610 A | | 5/1998 | Wada et al. | | |
| 5,759,480 A | * | 6/1998 | Hennings et al. | ............ | 264/620 |
| 6,479,419 B2 | * | 11/2002 | Masuda | ........................ | 501/138 |
| 6,905,649 B2 | | 6/2005 | Zhan et al. | | |
| 7,365,958 B2 | | 4/2008 | Yamazaki et al. | | |
| 7,384,680 B2 | * | 6/2008 | Bi et al. | ........................ | 428/143 |
| 7,528,088 B2 | | 5/2009 | Umeda et al. | | |
| 7,910,510 B2 | * | 3/2011 | Paul et al. | ..................... | 501/137 |
| 7,939,007 B2 | | 5/2011 | Guillemet et al. | | |
| 8,064,190 B2 | | 11/2011 | Taniguchi et al. | | |
| 8,097,551 B2 | | 1/2012 | Kamigaki et al. | | |
| 2003/0013598 A1 | | 1/2003 | Hagiwara et al. | | |
| 2003/0125189 A1 | * | 7/2003 | Castro | ..................... | C04B 33/14 |
| | | | | | 501/127 |
| 2004/0201137 A1 | | 10/2004 | Zhan et al. | | |
| 2006/0251927 A1 | | 11/2006 | Umeda et al. | | |

(Continued)

FOREIGN PATENT DOCUMENTS

JP      2008288428      11/2008

*Primary Examiner* — Nahida Sultana
(74) *Attorney, Agent, or Firm* — C. John Brannon; Brannons Sowers & Cracraft PC

(57) ABSTRACT

A high energy density multilayer ceramic capacitor, having at least two electrode layers and at least one substantially dense polycrystalline dielectric layer positioned therebetween. The at polycrystalline dielectric layer has an average grain size of less than about 300 nanometers, a particle size distribution of between about 150 nanometers and about 3 micrometers, and a maximum porosity of about 1 percent. The dielectric layer is selected from the group including $TiO_2$, $BaTiO_3$, $Al_2O_3$, $ZrO_2$, lead zirconium titanate, and combinations thereof and has a breakdown strength of at least about 1100 kV per centimeter.

24 Claims, 16 Drawing Sheets

(56) References Cited

U.S. PATENT DOCUMENTS

2009/0135546 A1    5/2009   Wang et al.
2010/0027191 A1    2/2010   Guillemet et al.

\* cited by examiner

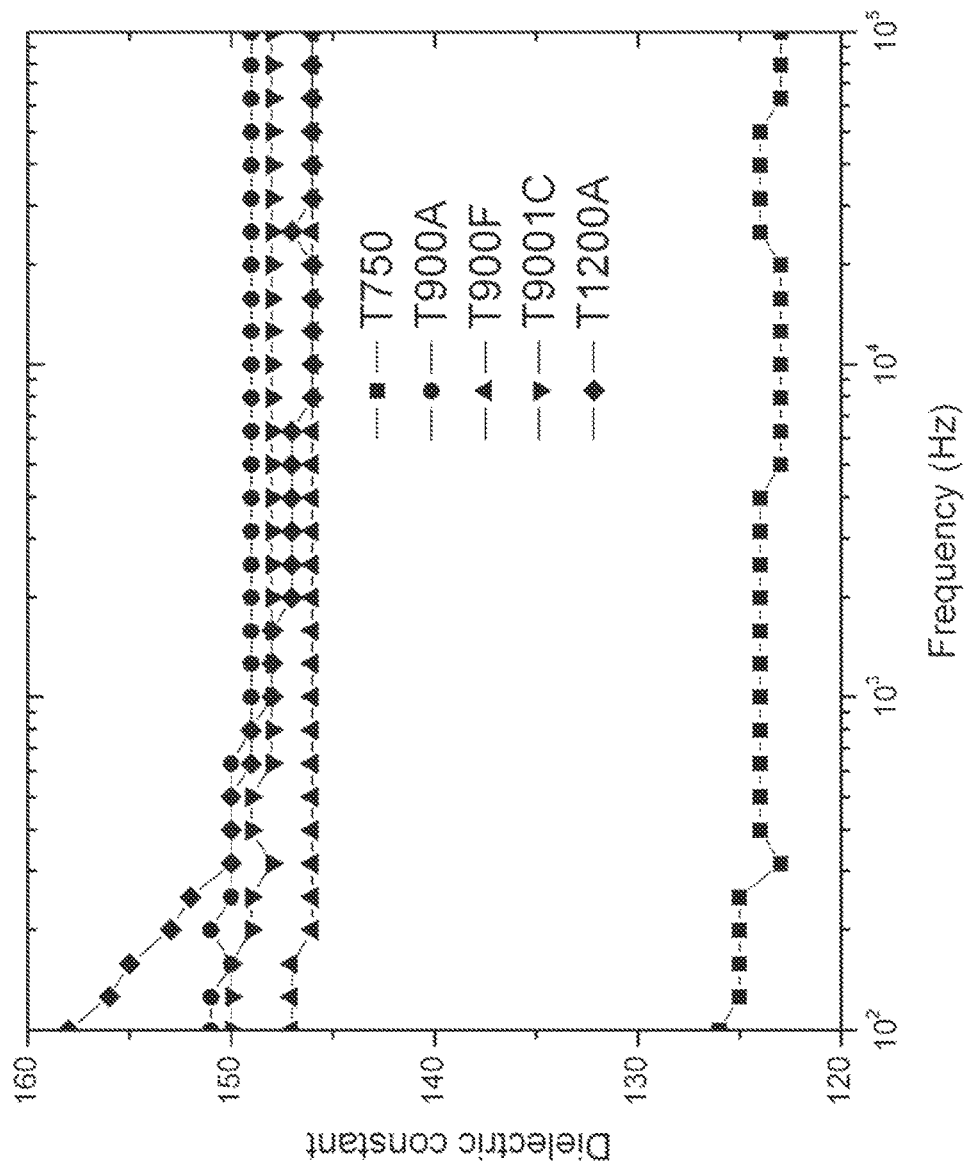

NANOSTRUCTURED DIELECTRIC MATERIALS FOR HIGH ENERGY DENSITY MULTI LAYER CERAMIC CAPACITORS

CROSS-REFERENCE TO RELATED APPLICATIONS

This application is a divisional of co-pending U.S. patent application Ser. No. 12/550,373, filed on Aug. 29, 2009, and claims priority thereto.

GRANT STATEMENT

The invention was made in part from government support under Grant No. RG001083 from the National Science Foundation (NSF/IUCRC Center for Dielectric Studies) and under Grant No. N000-14-05-1-0541 from the Office of Naval Research. The U.S. Government has certain rights in the invention.

TECHNICAL FIELD

The present invention relates to the field of ceramic science and, more particularly high energy density multi-layer ceramic capacitors.

BACKGROUND

Titanium dioxide ($TiO_2$) is one of the most widely used ceramic materials, having a broad range of applications such as pigments, sensors, waste treatment, solar cells and capacitors. Nanocrystalline $TiO_2$ ceramics have been the subject of great interest to researchers over the years. Research has been conducted in such diverse areas as $TiO_2$ nanopowder synthesis, thin film fabrication, and the sintering of bulk ceramics. However, thus far pure $TiO_2$ nanopowder material has seldom been used as a dielectric material for capacitor applications as it can easily be reduced, leading to devices having lower resistivity and high dielectric loss, even though the intrinsic dielectric loss of stoichiometric $TiO_2$ is very low.

Therefore, there is a need to provide a new and improved bulk $TiO_2$ material characterized by nano-scale grain size that might contribute to the achievement of the desired overall dielectric properties for applications in high energy density capacitors. There is also a corresponding need to provide a new and improved method for fabricating a $TiO_2$ material having a nano-scale grain size. The present invention addresses these needs.

SUMMARY OF INVENTION

In one aspect of the invention, a new and improved ceramic material for high energy density capacitor applications is described. The inventive ceramic material comprises at least one layer of dense dielectric ceramic with nano-size grain and substantially no residual porosity. The exemplary dielectric ceramic materials are $TiO_2$, alumina, stabilized $ZrO_2$, $BaTiO_3$, and PZT.

In another aspect of the invention, a method for producing substantially theoretically dense nano-structured dielectric ceramic material is described. The fabrication method includes the steps of 1) compacting a preselected ceramic powder into a green body, and 2) sintering the green body in an oxidizing atmosphere, such as substantially pure oxygen, at a pre-selected time/temperature profile. For example, the sintering temperature for $TiO_2$ may range from 750° C. to 1200° C., with less than 900° C. being typical, while the soak time at 750° C. may be about 13 hours while the soak time at 1200° C. may be around 2-3 hours.

In yet another aspect of the invention, a new and improved high energy density capacitor is described. The high energy density capacitor includes at least one layer of substantially dense $TiO_2$ ceramic material with a substantially nano-sized grain structure. As used herein, high energy density generally means greater than about 2 $J/cm^3$, and nanoscale generally means particles smaller than about 500 nanometers in diameter or major axial direction. Such dielectric materials may be used to fabricate Multi Layer Ceramic Capacitors (MLCCs).

BRIEF DESCRIPTION OF DRAWINGS

FIG. 7A is a plot illustrating the dielectric constants of the sintered bodies.

DETAILED DESCRIPTION OF INVENTION

Figure 1:
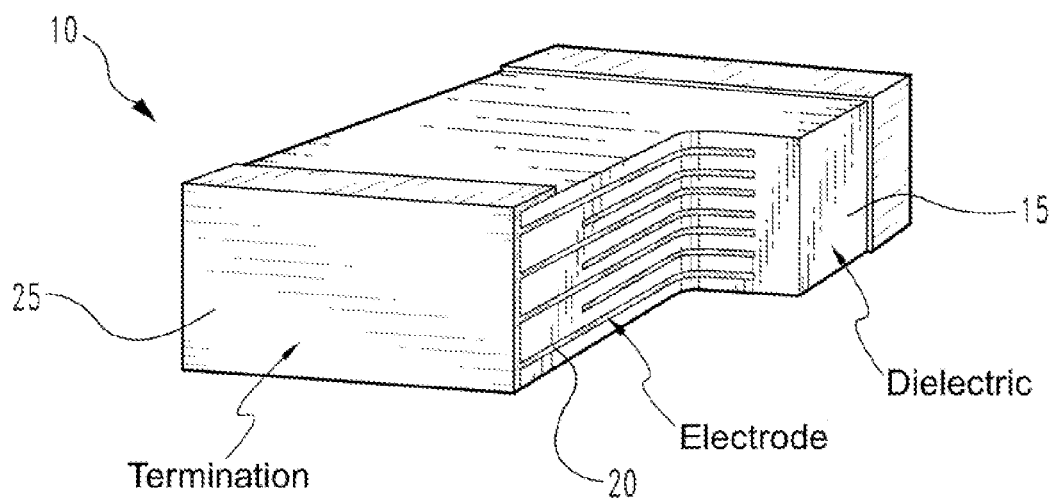
FIG. 1 is a schematic illustration of a multilayer capacitor according to a first embodiment of the present invention.

For the purposes of promoting an understanding of the principles of the novel technology, reference will now be made to the embodiments illustrated in the drawings and specific language will be used to describe the same. It will nevertheless be understood that no limitation of the scope of the novel technology is thereby intended, such alterations and further modifications in the illustrated device, and such further applications of the principles of the novel technology as illustrated therein being contemplated as would normally occur to one skilled in the art to which the novel technology relates.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety.

The properties of ceramics (both mechanical properties and electrical properties) heavily depend on their microstructural features, such as grain size, porosity, secondary phase and the like, and it is possible to enhance some desired properties by manipulating the microstructure of ceramics. The invention defines a new and improved nanostructured ceramic material with attractive dielectric properties, such as low intrinsic dielectric loss and high breakdown strength.

Generally there are two key parameters that will determine the energy density of dielectric materials: one is the dielectric constant and the other is dielectric breakdown strength (highest field the dielectric material can withstand). The volumetric energy density of dielectrics is determined by:

$$W = \int_0^{Eb} \varepsilon_0 \varepsilon_r(E) E dE \quad (1)$$

where W is volumetric energy density (J/cm$^3$), $\varepsilon_0$ is the permittivity of free space, $\varepsilon_r$ is the relative permittivity of the dielectric material, E is the electrical field, and $E_b$ is the dielectric breakdown strength. For linear dielectric materials, equation (1) can be simplified to $$W = \frac{1}{2}\varepsilon_0 \varepsilon_r E_b^2 \quad (2)$$

which implies that the energy density is primarily a function of the dielectric breakdown strength.

According to a first embodiment, the novel nanostructured dielectric material is composed of at least one layer of nanostructured dielectric ceramic material. In other words, the ceramic material has a nano-scale grain size and no residual porosity. One exemplary material is titania (TiO$_2$). As grain size decreases from 10 μm to 200 nm, the breakdown strength of TiO$_2$ increases from about 550 KV/cm to about 1100 KV/cm. Referring to Eq. 2, nanostructured and dense TiO$_2$ having increased breakdown strength should be a good candidate material for high energy density capacitors. Other nanostructured and dense dielectrics materials including but not limited to Al$_2$O$_3$, stabilized ZrO$_2$, BaTiO$_3$, and PZT should also exhibit high electrical breakdown strength as compared to their conventional counterparts having a grain structure in micrometer range (>1 μm). Typical grain size and density limits for nanostructured dielectrics are less than about 300 nm and greater than about 99.9% of theoretical density (or less than about 0.1% porosity), respectively.

The present invention also provides a method for fabrication of the novel dielectric material, which typically includes at least one layer of nanostructured dielectric ceramic material. The inventive fabrication method generally comprises the steps of 1) compacting a pre-selected dielectric material powder into a pellet and 2) sintering the pellet in a substantially oxidizing atmosphere, such as pure oxygen, and at a predetermined temperature and for a predetermined length of time, such that the time/temperature profile is sufficient to sinter the dielectric material to substantially theoretical density without giving rise to undue grain growth and yielding a microstructure characterized by substantially uniform grain size.

The invention provides an exemplary fabrication of nanostructured TiO$_2$. Specifically, any commercially available nanosized TiO$_2$ powders (particle size <50 nm) may be selected as starting material for the inventive nanostructured TiO$_2$. In the compacting step, the powders may be compressed by any convenient method, such as uniaxially compacted in a die at about 50 MPa to obtain a pellet, may then be statically compacted at a pressure of about 300 MP; however, any convenient compaction method may be used to produce a green body pellet or substrate.

In the sintering step, the densification of the green body may be conducted at sufficient temperature, typically between about 750° C.-1200° C., in a sufficiently oxidizing atmosphere, such as pure oxygen at ambient pressure or flowing air, and with a sufficiently slow cooling profile (such as furnace cooling or a cooling rate of about 1° C./min or less). Sintering in an oxidizing atmosphere and cooling at slow rates (less than about 1° C./min) facilitate oxidation (or at least retard reduction) of the oxide dielectric material (in this example, TiO$_2$), which results in more uniform and thus improved dielectric properties of the material. During the oxygenation process, the number of oxygen vacancies in TiO$_2$ is reduced to yield a material having reduced loss and leakage current.

Another aspect of the present novel technology is the provision of a new and improved high energy density capacitor that incorporates at least a layer of nanostructured ceramic material as described herein, and typically with a multilayered structure. For example, the multiple layers of the nanostructured TiO$_2$ separated by layers of electrode material may be employed to build single or multilayer ceramic capacitors for applications requiring high energy density storage (>5 J/cm$^3$). A schematic drawing of a multilayer capacitor 10 is shown FIG. 1, with the nanostructured TiO$_2$ layer 15 and the electrode layer 20 staged in alternative to each other. Alternate electrode layers 20 are electrically connected to each terminal end or termination 25, respectively. MLCCs are essentially stacks of capacitors packaged together, and take advantage of the phenomena that energy storage increases as the number and area of the dielectric layers increase and the thicknesses of the dielectric layers decrease.

EXAMPLES

I Microstructural Developments and General Testing Conditions

NANOTEK® TiO$_2$ powders were obtained as starting materials for MLCC production, with powder characteristics and main impurity levels reproduced from the included product data sheet as Tables 1 and 2, respectively (NANOTEK is a registered trademark of Nanophase Technologies Corporation, 1319 Marquette Drive, Romeoville, Ill., 60446, Reg. No. 1978354). Green compacts were prepared by uniaxial pressing at 50 MPa and subsequent cold isostatic pressing at 300 MPa. Sintering was conducted at various temperatures (750° C.-1200° C.) in pure oxygen (1 atm.) or air with different cooling rates (furnace cooling or 1° C./min cooling rate).

TABLE 1

Characteristics of the starting powders

| Characteristics | Value |
| --- | --- |
| Purity | 99.9% |
| Average particle size (nm) | 40 |
| Specific surface area (m$^2$/g) | 38 |
| Bulk density (g/cm$^3$) | 0.20 |
| True density (g/cm$^3$) | 3.95 |
| Crystal phase | 80% anatase and 20% rutile |

TABLE 2

Main impurities in the TiO$_2$ powder

| Elements | Impurity level (%) |
| --- | --- |
| Fe | 0.037 |
| Mg | 0.032 |
| gCa | 0.024 |
| Al | 0.0089 |

Figure 2:
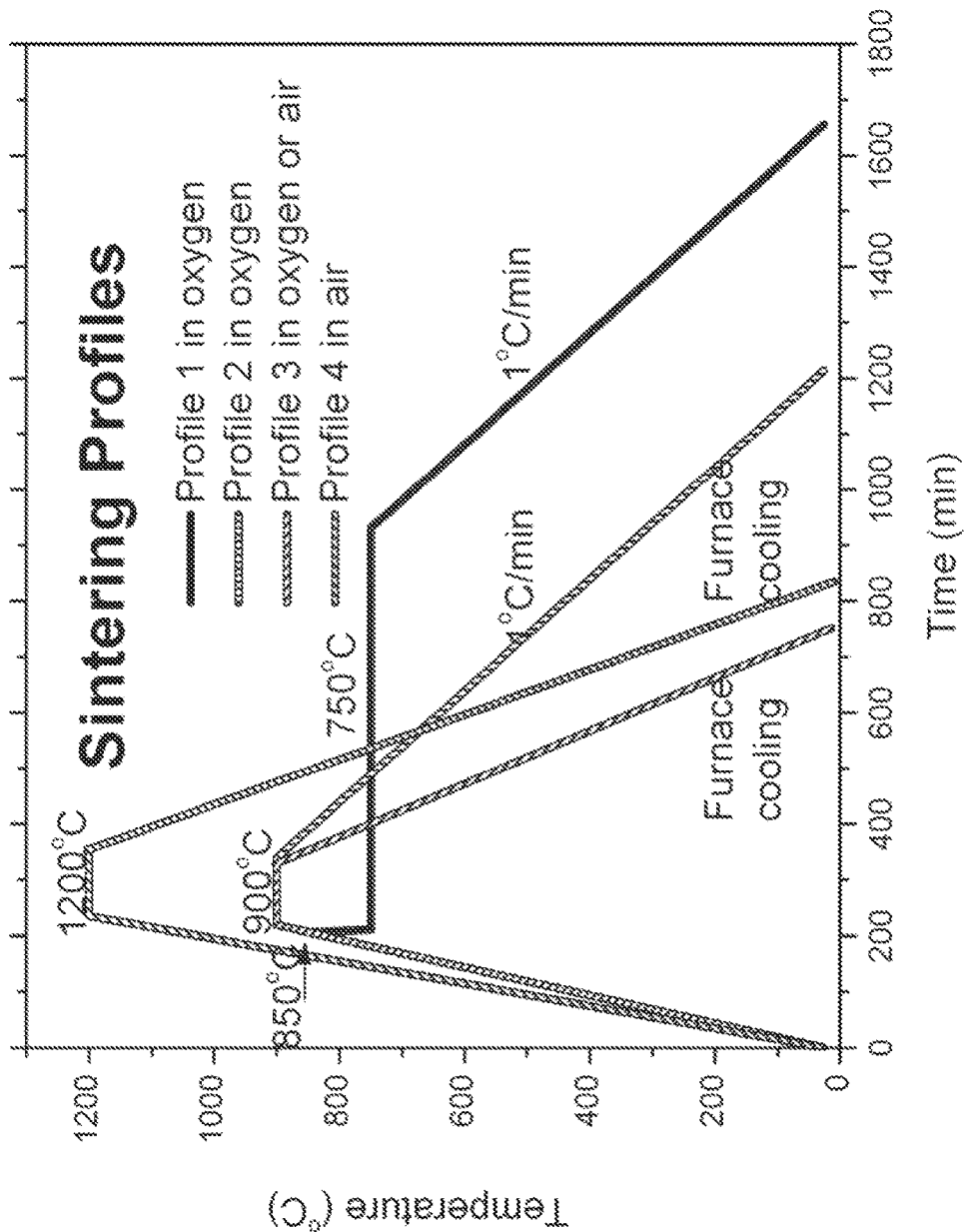
FIG. 2 summarizes the sintering profiles of sintered titania bodies having microstructures characterized by nano-scale grain size and particle size distributions according to a second embodiment of the present invention.

FIG. 2 summarizes the sintering profiles of each sample, among which profile 1 was conducted according to a two-step sintering procedure. The -two-step sintering process involves a rapid heating of a green body to a predetermined temperature, typically without a hold-time, followed by a rapid cooling to a lower temperature at which the presintered material is soaked for a relatively long time in order to achieve densification. While this two-step technique has been effective in some cases to obtain dense ceramics with very small grain size or little grain growth during sintering, the two-step process is typically unnecessary to achieve densified nanostructured titania and like substrates. Conventional sintering, at heating rates on the order of 5° C./min up to about 800° C. and with 6 hours soak time in oxygen or oxidizing atmospheres was sufficient to achieve substrates having excellent dielectric properties.

The relative density of each sample was determined by Archimedes' method using water as the immersion liquid and assuming the theoretical density of anatase and rutile TiO$_2$ are 3.89 g/cm$^3$ and 4.25 g/cm$^3$, respectively. Phase evolution was identified by XRD and the microstructure of the as-fired surface of TiO$_2$ ceramics was observed by SEM. Grain size was determined by the liner intercept method on SEM photomicrographs.

Samples of 10 mm diameter and 0.6 mm thickness were prepared for electrical property measurements. The sample surfaces were polished via 1 μm diamond suspension and painted with sliver paste as top and bottom electrodes. After electroding, the samples were baked at 300° C. to ensure good contact between sample surface and the silver electrodes. D.C. conductivity and current-voltage characteristics were measured by a two-probe method in ambient atmosphere. Impedance spectroscopy was measured in the frequency range of 1 Hz-1 MHz with a voltage amplitude of 1V and analyzed. Relative dielectric constant values were calculated from the capacitance as measured. Polarization versus electrical field relationships were measured on a ferroelectric tester. For breakdown strength (BDS) measurements, D.C. voltage was supplied by a high voltage generator with a fixed ramp rate of 200V/second.

Figure 3:
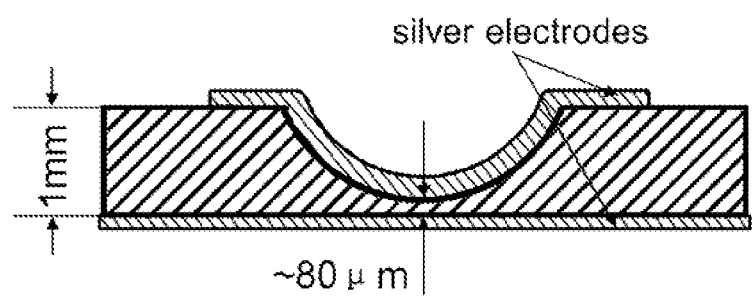
FIG. 3 is a schematic illustration of a body of FIG. 2 having a dimpled electrode configuration for BDS measurement.

A dimpled electrode configuration was employed for BDS measurements, as shown in FIG. 3, so as to minimize contributions of edge-effects of the electric field and thus enjoy the maximum electrical stress concentration at the bottom of the dimple, as this specific specimen configuration reduces/suppresses the phenomenon of edge breakdown.

II Sample Characterization

Figure 4:
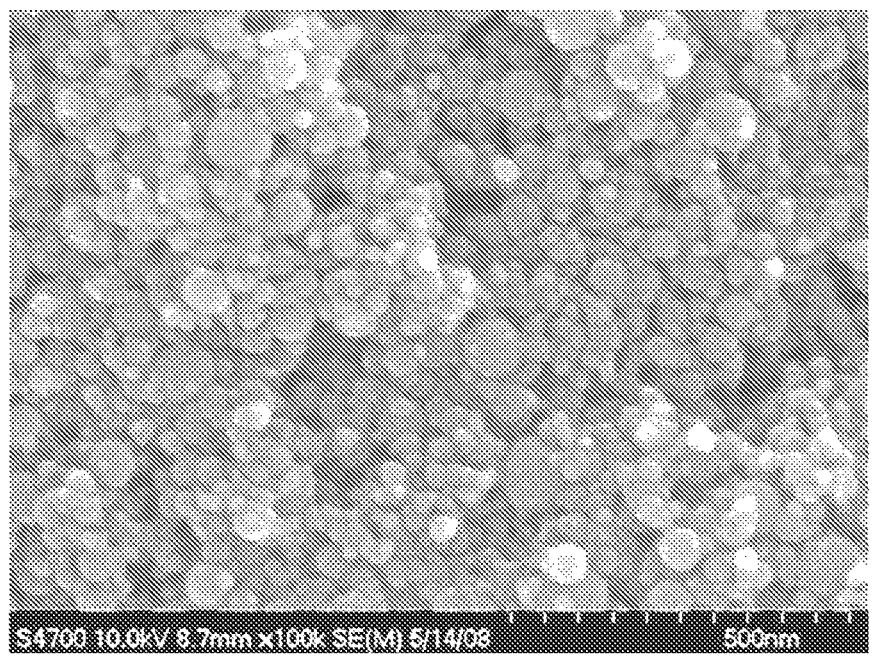
FIG. 4 is the SEM photomicrograph of precursor $TiO_2$ nano powders.

FIG. 4 is the SEM image of the starting powders, which shows that the powders are typically composed of particles that are generally spherical in shape and with a particle size less than 50 nm. The relative density of TiO$_2$ ceramics sintered in various conditions is summarized in Table 3. Table 3 shows that except for sample T750, all the other samples achieved a relative density higher than 98%. By using the two-step sintering procedure, nanosized TiO$_2$ powders can be sintered to a relative density of about 96% at temperatures as low as 750° C. All samples sintered at 900° C. achieved almost identical relative densities of about 99%, suggesting that sintering atmosphere and cooling rate do not have a significant effect on the densification process.

TABLE 3

Relative density obtained in various sintering conditions

| Sintering conditions | Sample name | Relative density (%) |
| --- | --- | --- |
| 850° C.-750° C. 12 h in O$_2$ 1° C./min cooling rate | T750 | 95.61 |
| 900° C. 2 h in air furnace cooling | T900A | 99.23 |
| 900° C. 2 h in O$_2$ furnace cooling | T900F | 98.80 |
| 900° C. 2 h in O$_2$ 1° C./min cooling rate | T9001C | 98.89 |
| 1200° C. 2 h in air furnace cooling | T1200A | ~100 |

Figure 5:
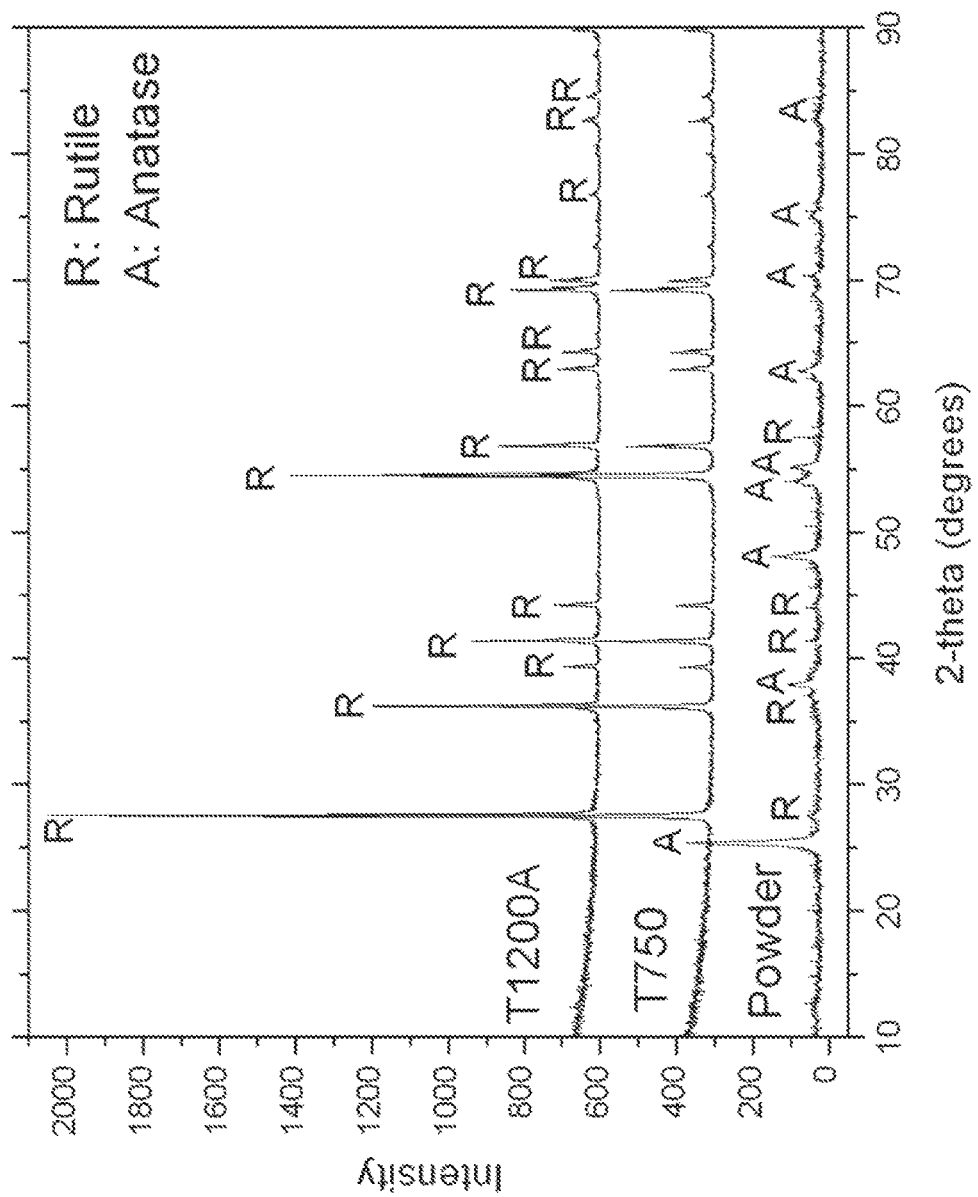
FIG. 5 is a plot illustrating the XRD profiles of precursor powder and two sintered bodies (T1200A and T750).

FIG. 5 shows the XRD patterns of the samples (T750 and T1200A) sintered in different conditions together with the staring powder (Powder). As shown in FIG. 5, the starting powder is mainly composed of anatase, while there is no anatase phase left in the sintered samples. Normally, the anatase to rutile transition temperature is about 915° C. In this case, nanosized starting powders may help to reduce the transition temperature. No secondary phase is detected, therefore, as sintered samples are all phase pure rutile TiO$_2$.

Figure 6A:
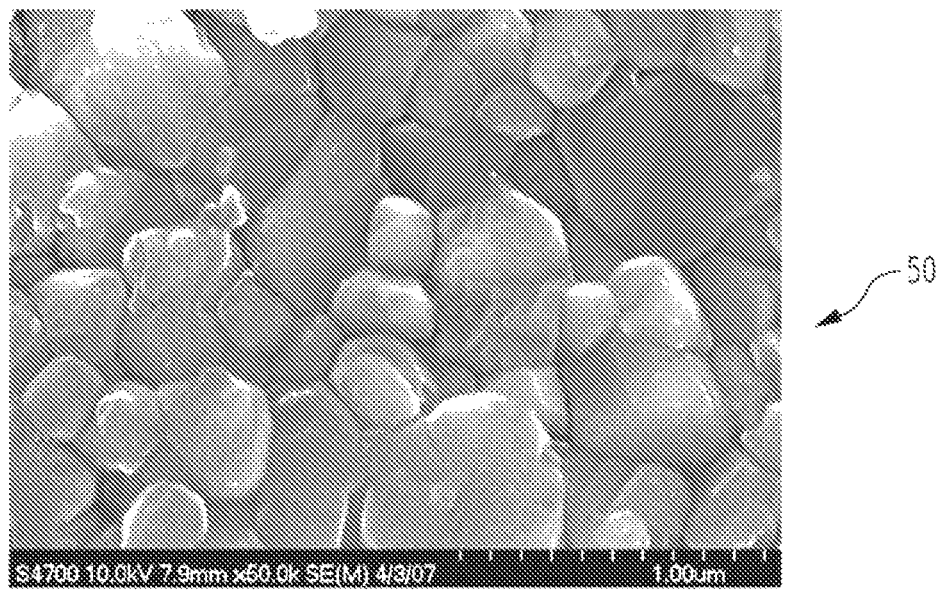
FIG. 6A is a first SEM photomicrograph of the sintered bodies.
Figure 6B:
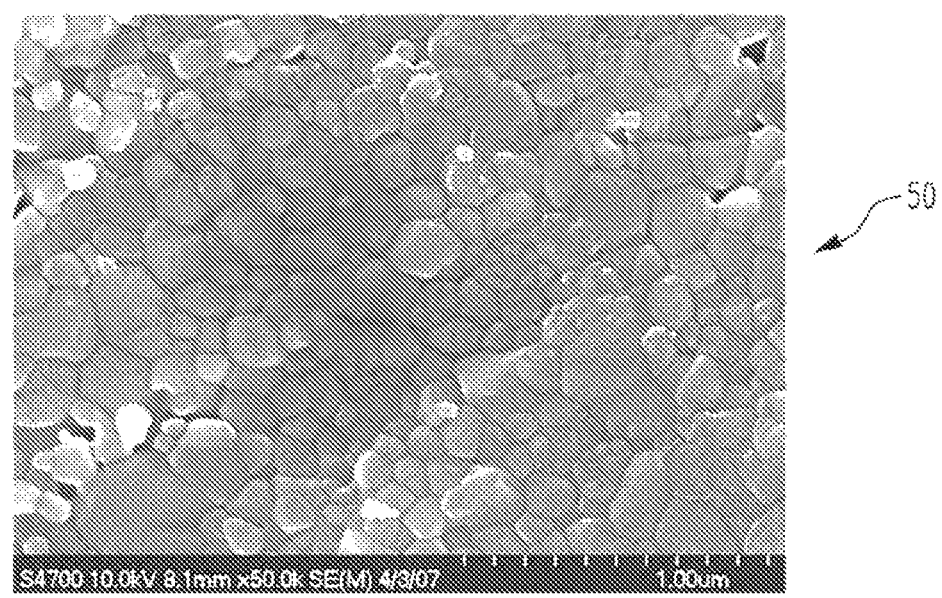
FIG. 6B is a second SEM photomicrograph of the sintered bodies.
Figure 6C:
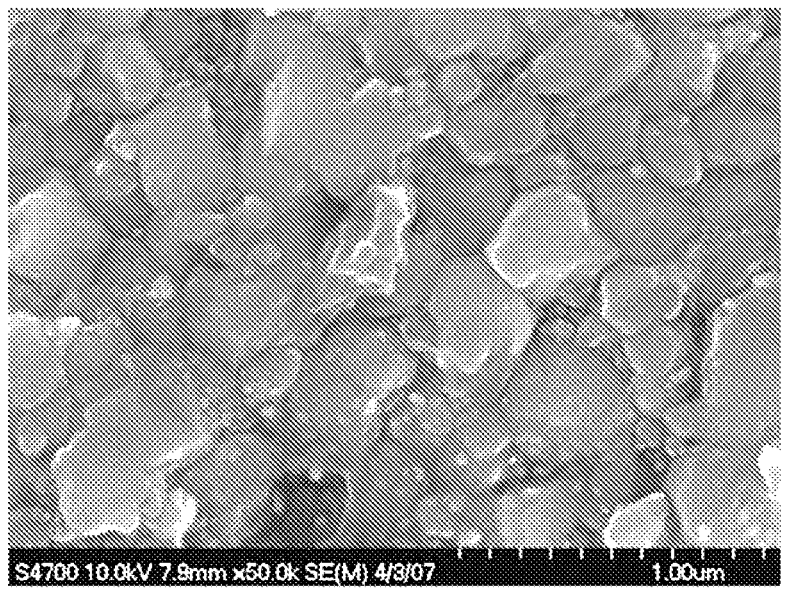
FIG. 6C is a third SEM photomicrograph of the sintered bodies.
Figure 6D:
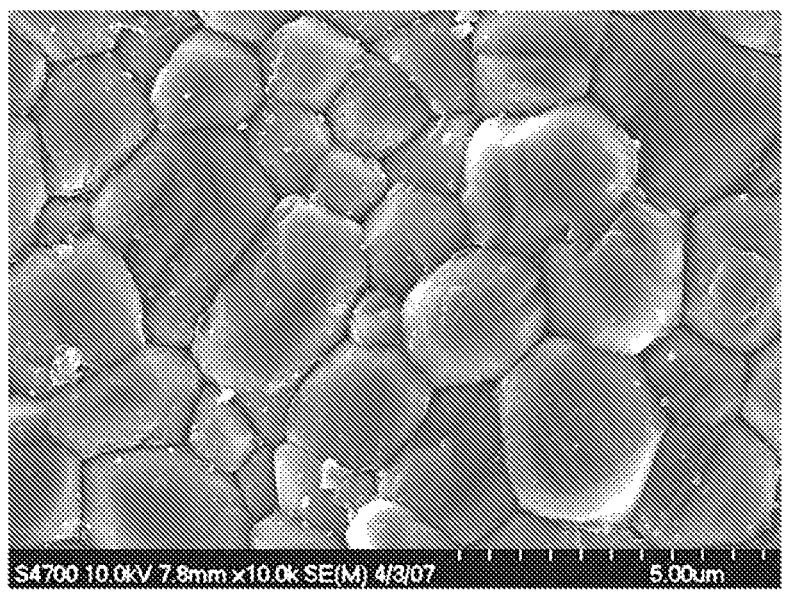
FIG. 6D is a fourth SEM photomicrograph of the sintered bodies.

FIGS. 6A to 6D show the representative SEM images of the microstructure of TiO$_2$ ceramic substrates 50 sintered at different conditions. FIG. 6A shows that the grain size is about 150 nm for specimen 50 sintered at 750° C.; FIG. 6B shows that the grain size is about 300 nm for a substrate 50 sintered at 900° C.; and FIGS. 6C and 6D show that the grain sizes further grow to about 3 μm after sintering substrates 50 at 1200° C. Furthermore, as shown in FIGS. 6A to 6D, the bimodal distribution of grain size indicates that grain grows via an Oswald-ripping mechanism.

III Dielectric Properties of the Samples

FIG. 7A shows the dielectric constant of each sintered sample. Over the frequency range from 100 Hz to 100K Hz, the dielectric constants of all samples show little or no dispersive characteristics. As shown in FIG. 7A, sample T750 has the lowest dielectric constant around 125, while the other samples have higher dielectric constants about 145. Residual porosity is believed to be the major reason that leads to lower dielectric constant of sample T750. The previous studies have shown that the dielectric constant of TiO$_2$ single crystal (rutile) along c-orientation is about 170 and along the a-orientation is about 86. The randomly orientated polycrystalline TiO$_2$ ceramics is believed to have a dielectric constant around 100. The sintered samples tend to be slightly oriented, resulting in the higher dielectric constants than expected.

Figure 7B:
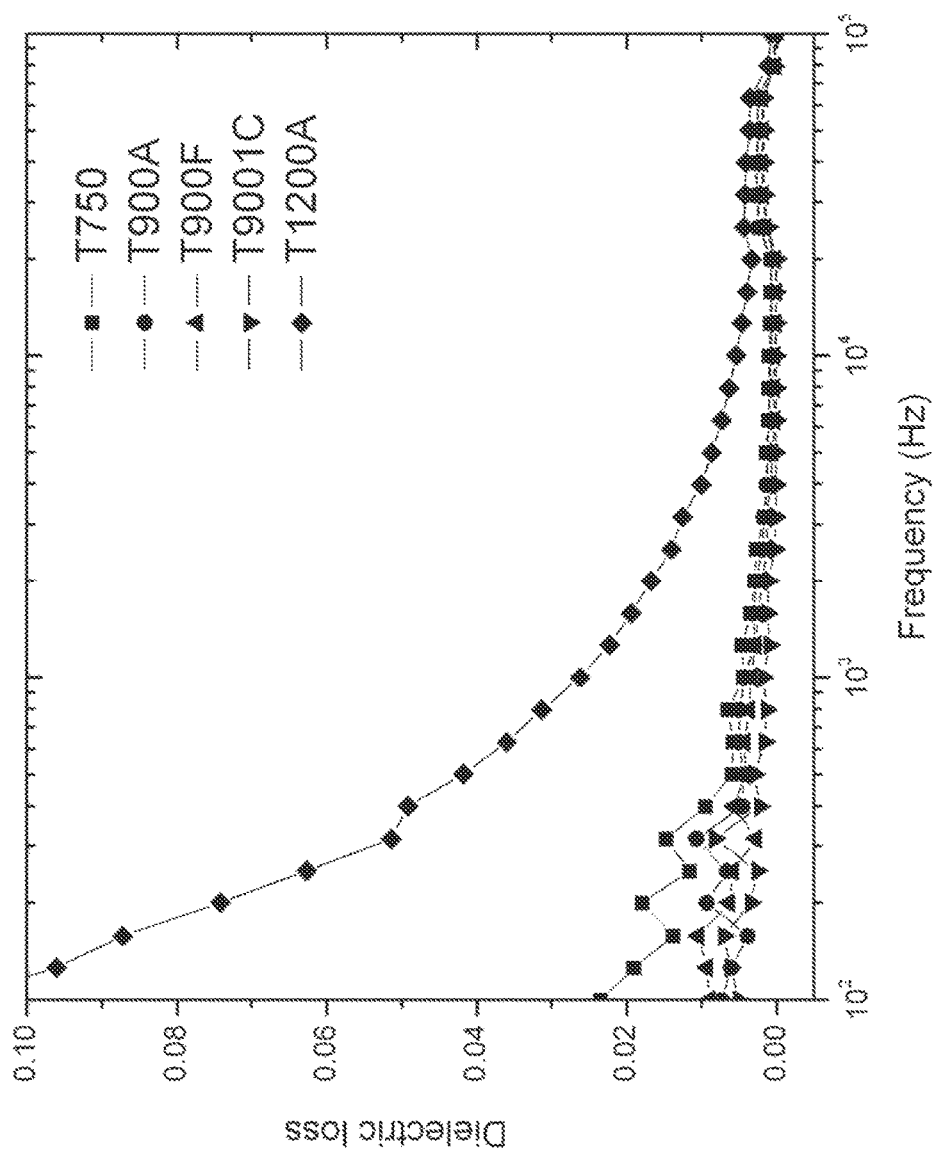
FIG. 7B is a plot illustrating the dielectric loss of the sintered bodies.

FIG. 7B illustrates the dielectric loss of the sintered samples. Dielectric loss is generally low, especially in the high frequency range, such that the dielectric loss is about 0.04% for sample T9001C at 100K Hz. In FIG. 7B, sample T1200A has the highest dielectric loss followed by sample T750. The relative high dielectric loss of sample T750 may be attributed to its surface conduction due to its relatively low density. Samples T1200A was sintered in air at high temperature, indicating that the loss may associate with oxygen vacancies generated during high temperature sintering.

It is widely believed that the predominant defects in n-type $TiO_2$ are oxygen vacancies, which may be expressed by Kröger-Vink notation as follows:

$$O_o^X = V_o^{\bullet\bullet} + 2e' + \frac{1}{2}O_2 \qquad (3)$$

Based on equation (3), two extra electrons may be generated for each oxygen vacancy created. As a result, relatively high conductivity is expected in samples with high concentration of oxygen vacancies. As shown in FIG. 7B, the dielectric loss increases with decreasing frequency for sample T1200A, which may be a characteristic of conduction loss, since normally conduction loss is the dominate loss mechanism at lower frequencies.

Figure 8:
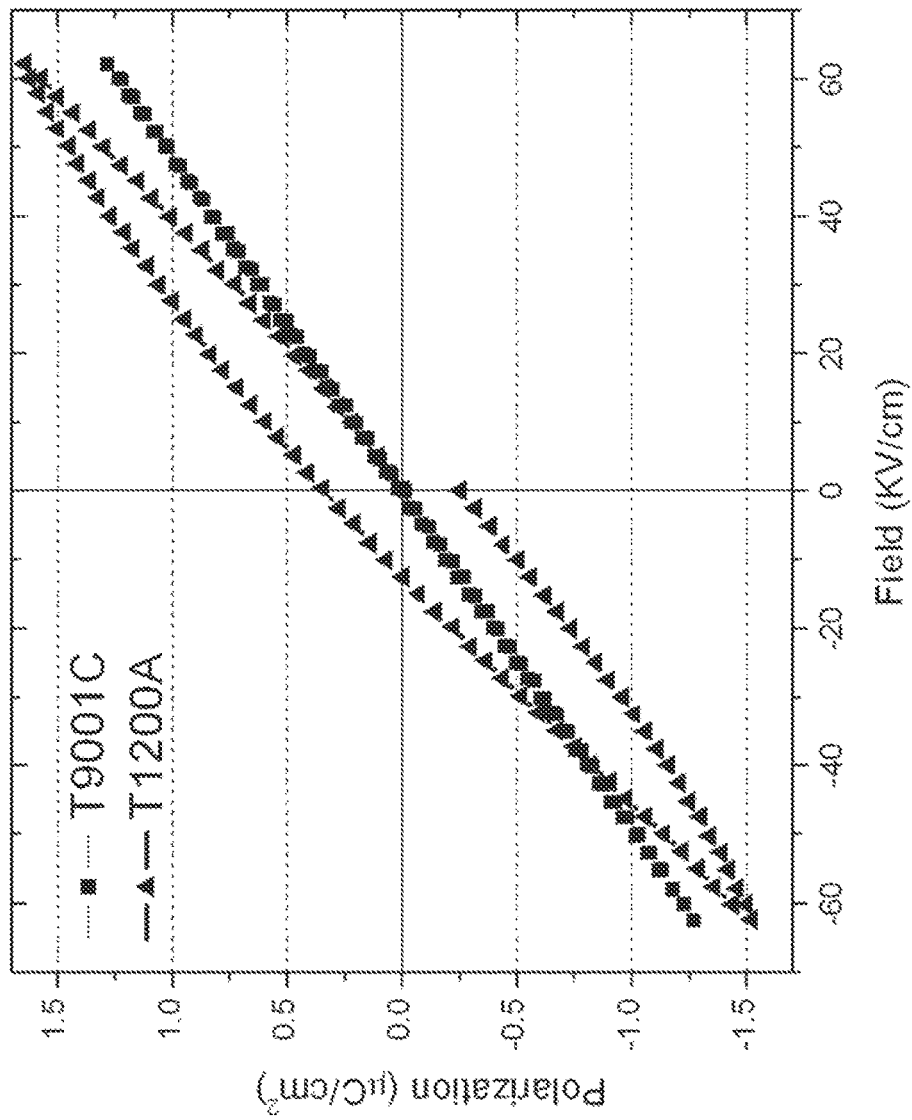
FIG. 8 is a plot illustrating the polarization vs. electrical field of the sintered bodies.

FIG. 8 shows the Polarization versus Electric field (P-E) relationship of two sintered samples (T9001C and T1200A). As shown in FIG. 8, the P-E curve of Sample T1200A demonstrates hysteresis loop, an indication of conduction loss. On the contrary, the P-E curve of Sample T9001C is of a linear P-E relation with polarization about 1.25 $\mu C/cm^2$ at 62 KV/cm. A calculation based on the slope of the P-E curve of Sample T9001C gives a dielectric constant of 228, which is higher than what measured in FIG. 7A. Since polarization was measured at low frequency, enhanced dielectric constant may come from the contribution of space charge polarization.

Figure 9:
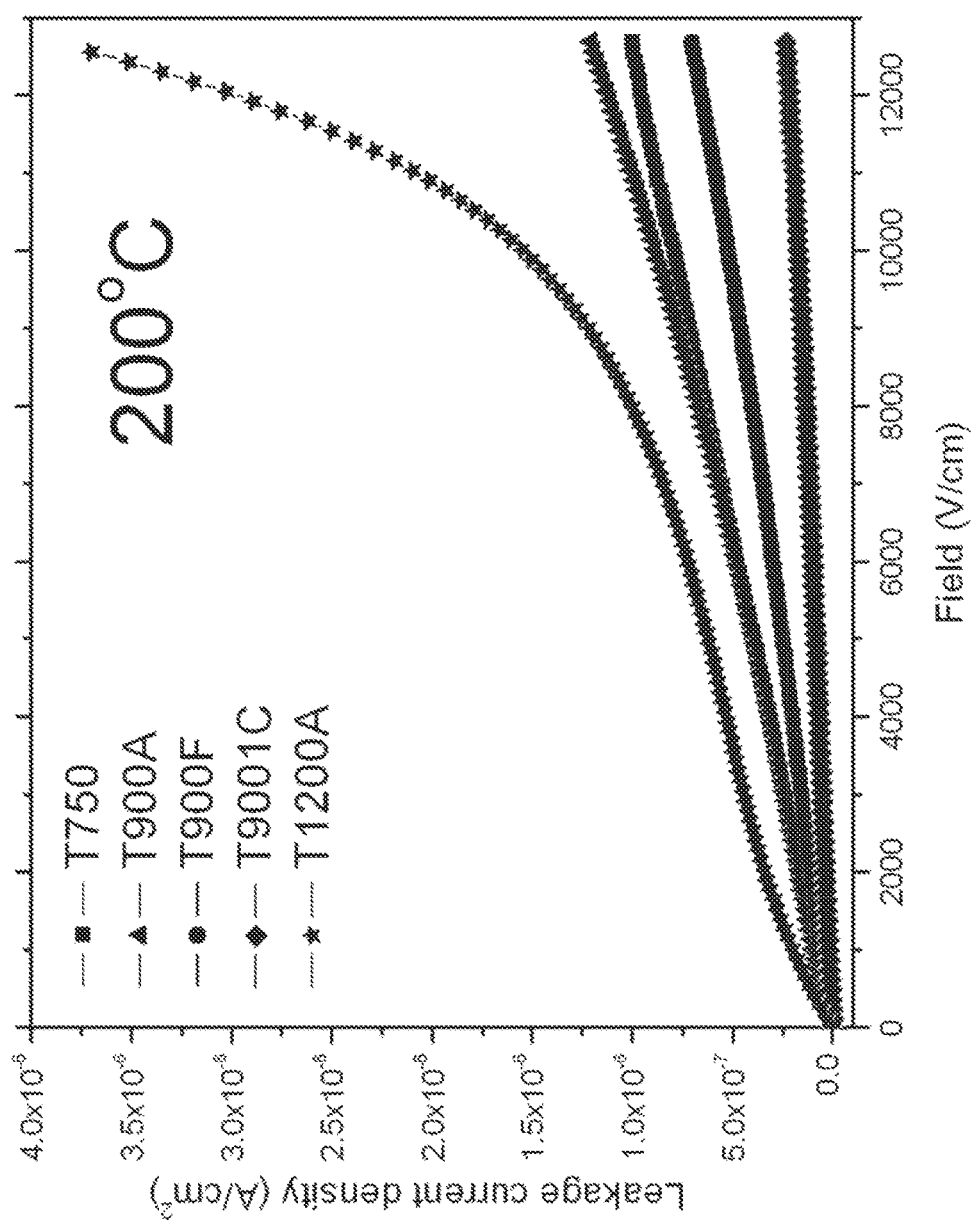
FIG. 9 is a plot illustrating the current-voltage characteristics of TiO2 ceramics sintered in various conditions.

FIG. 9 plots the Current-Voltage (I-V) characteristics of the sintered samples, where the leakage current densities were measured at 200° C. in ambient air. Sample T1200A demonstrated the highest leakage current with a non-linear behavior. The similar behavior has been found in single crystal rutile, which indicates field dependent conductivity, especially for reduced samples (Grant, 1959). The non-linear I-V characteristic observed of Sample T1200A is also an indication that this sample is not electrically uniform, some part of the microstructure (most likely grain boundaries) may start to breakdown at higher field strength. This phenomenon will be discussed in more detail below together with the interpretation of impedance spectra.

The Current-Voltage characteristics for the other samples are of the linear or ohmic behavior. As expected, sample T9001C, which was sintered in oxygen atmosphere and cooled off at a gradual cooling rate (1° C./min), has the lowest leakage current. Once again, a sintering condition in oxygen atmosphere followed by slow cooling is believed to help minimize the oxygen vacancy concentration and electrical conductivity. Particularly, the cooling rate is of interest as the defects concentration may 'freeze' at the high temperature level if there is not enough time for the sample to equilibrate with the sintering atmosphere during the cooling off process.

Figure 10:
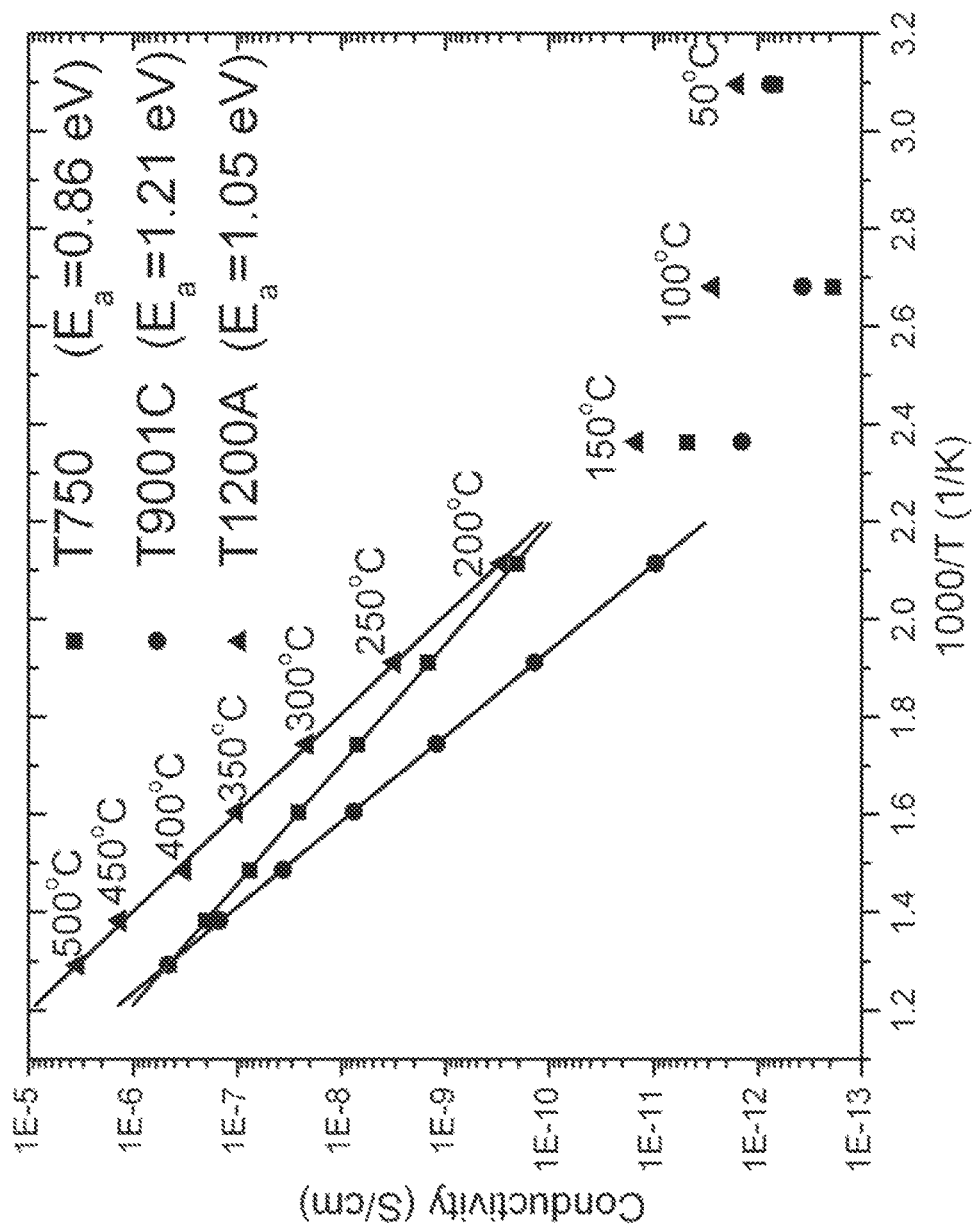
FIG. 10 is an Arrhenius plot of conductivity of $TiO_2$ ceramics sintered in various conditions.

FIG. 10 is an Arrhenius plot of conductivity of three sintered samples measured at low field (~160V/cm). Sample T1200A has the highest conductivity especially at high temperature range, while Sample T9001C demonstrates the lowest conductivity especially at low temperature range.

The conductivity can be used to determine the activation energy ($E_a$), which can be calculated in the temperature range of 200° C.-500° C. according to the following equation:

$$\sigma = \sigma_0 \exp(-E_a/kT) \qquad (4)$$

where $\sigma$, $\sigma_0$, $k$, and $E_a$ represent the conductivity, pre-exponential factor, Boltzmann constant and activation energy of mobile charge carriers, respectively.

The activation energies obtained in this study range from 0.86 eV to 1.21 eV, which are typical values of migration enthalpy for ionic defects. The activation energies of the sintered sample obtained in this study are comparable with literature, while less than those obtained from the single crystal samples. Sample T750's activation energy is much lower than those of the others, which may indicating a small grain size sample has lower activation energy. Similar phenomenon has also been observed in $CeO_{2-x}$ samples, which suggested that the atomic level origin of this behavior lies in the lower vacancy formation enthalpy at grain boundary sites.

FIG. 10 also shows that the linear relationship between conductivity and reciprocal temperature cannot be extended to temperature lower than 150° C. At 50° C., the conductivities of all three samples (~$10^{-12}$ S/cm) are much higher than the extrapolated values (would be in the range of $10^{-16}$ to $10^{-14}$ S/cm). The elevation of conductivity at low temperature indicates that the dominant conduction mechanism is ionic conduction, because at lower temperatures ions will not have enough thermal energy to substantially move. Interestingly, the conductivities measured at 50° C. are actually higher than those measured at 100° C. for sample T9001C and T750. This behavior may due to the effects of surface conduction in the presence of moisture.

Figure 11A:
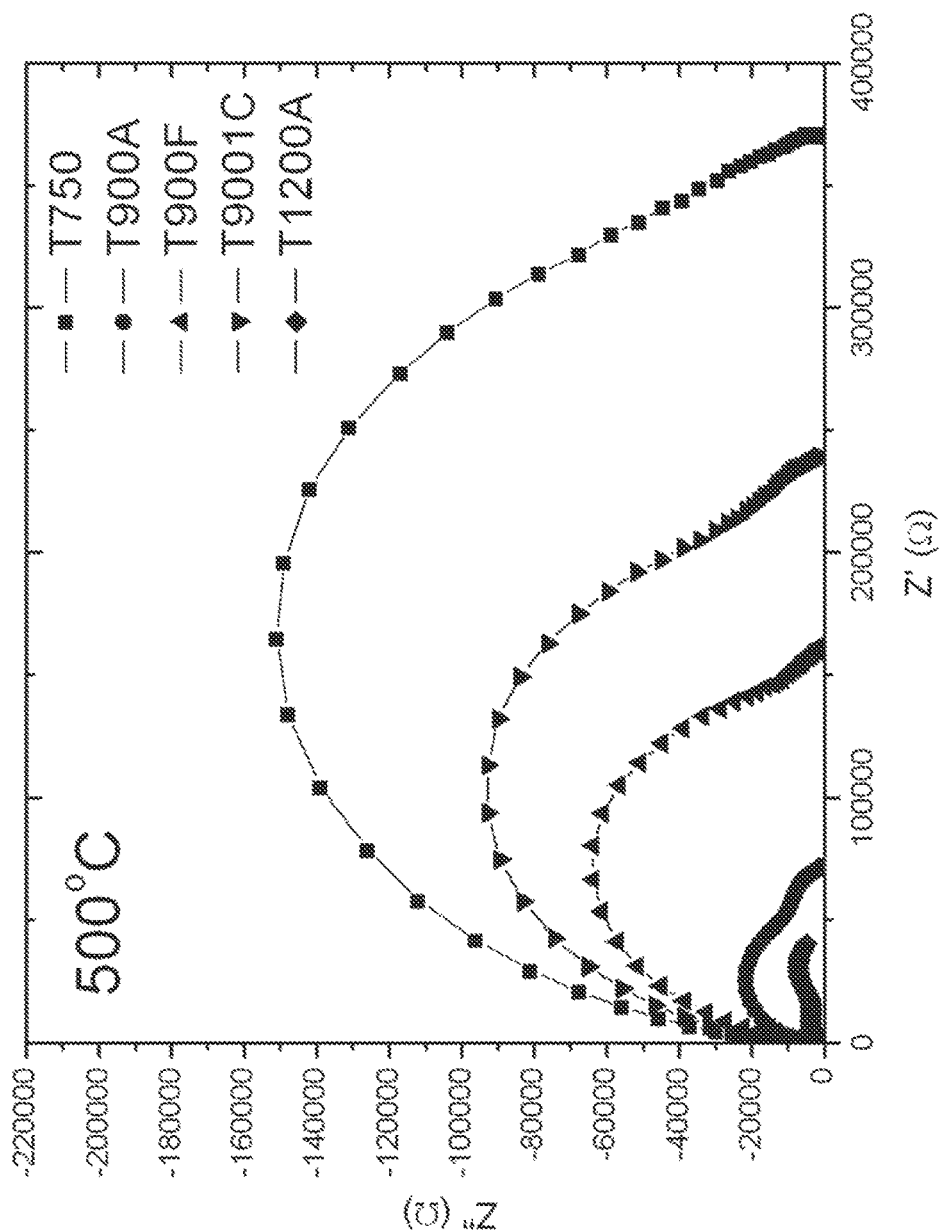
FIG. 11A shows complex impedance spectra of $TiO_2$ ceramics sintered in various conditions.

Impedance spectroscopy is a powerful technique used to characterize electronic ceramics, since it allows the intrinsic (bulk) properties to be distinguished from extrinsic contributions such as grain boundaries, surface layers, and electrode contact variations. The electrical responses of the sintered samples in the frequency range of 1 Hz to 1M Hz were measured at 500° C. and plotted in cole-cole curves as shown in FIG. 11A. In the order of T750-T9001C-T900E-T900A-T1200A, the overall resistances (intercept with the real axis, Z') of the samples decrease sequentially, which is in agreement with the D.C. conductivity measurements. Except for Sample T1200A, which shows two overlapped and depressed semi-circle, the plots of the cole-cole curves for the remaining samples have the general form of semi-circles.

Figure 11B:
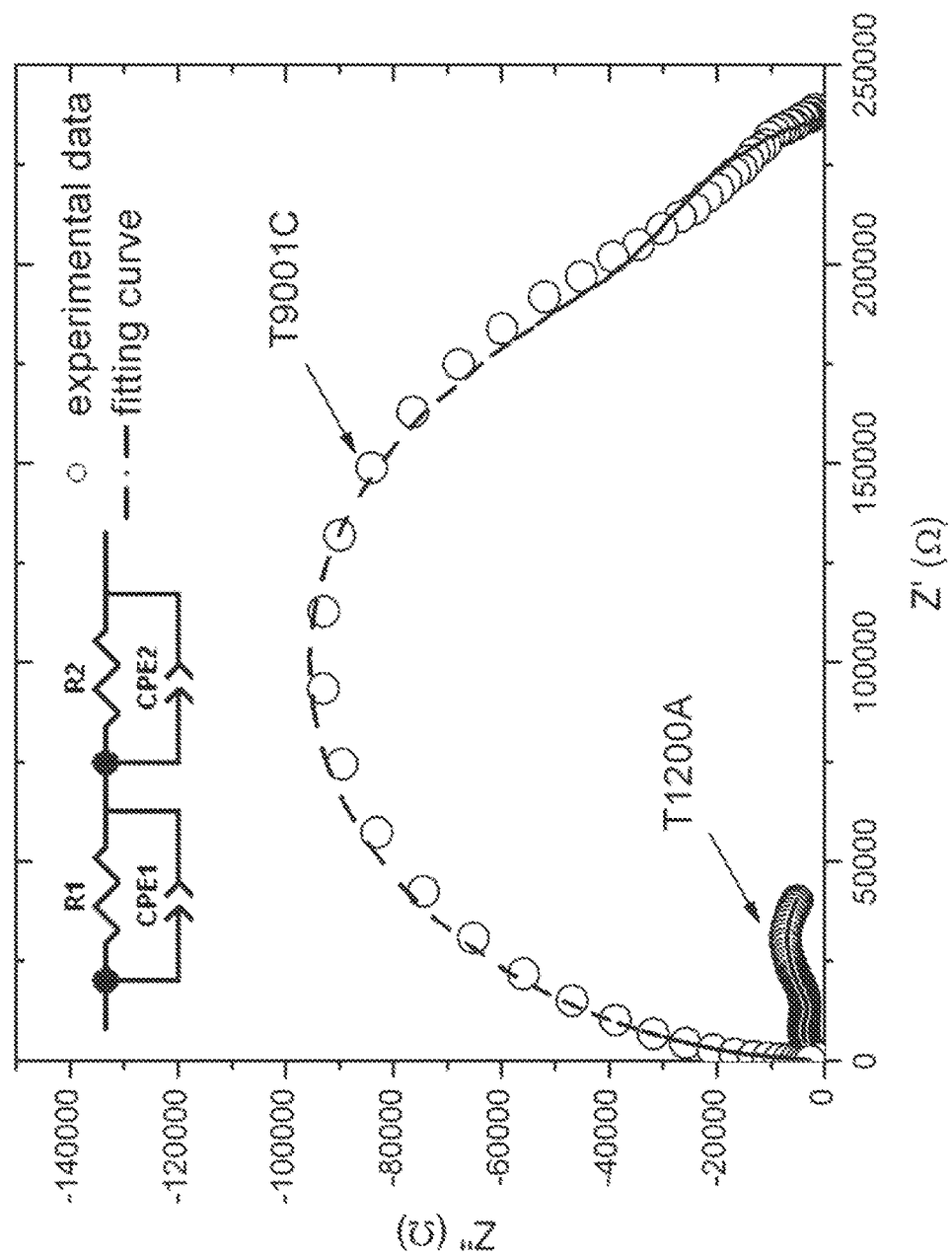
FIG. 11B shows the fitted curves of sample T9001C and T1200A.

The impedance spectra can be well fitted by using two R—C (resistor-capacitor) or R—CPE (resistor-constant phase element) parallel circuit elements connected in series, as shown in FIG. 11B. In FIG. 11B, the larger semi-circular plot is the response of the grain since the dielectric constant calculated based on capacitance value is around 150 corresponding well with the previous dielectric constant measurement. The second, smaller semi-circular plot located in the lower frequency range is normally attributed to the grain boundary response. Grain boundaries typically have higher electrical resistance (R) and capacitance (C) as compared to the R and C values of the grains themselves, and therefore the grain boundary relaxation time $\tau=RC$ is correspondingly larger. At characteristic frequency $f=(2\pi\tau)^{-1}$, the grain boundary frequency is lower than that of the grain.

Figure 12:
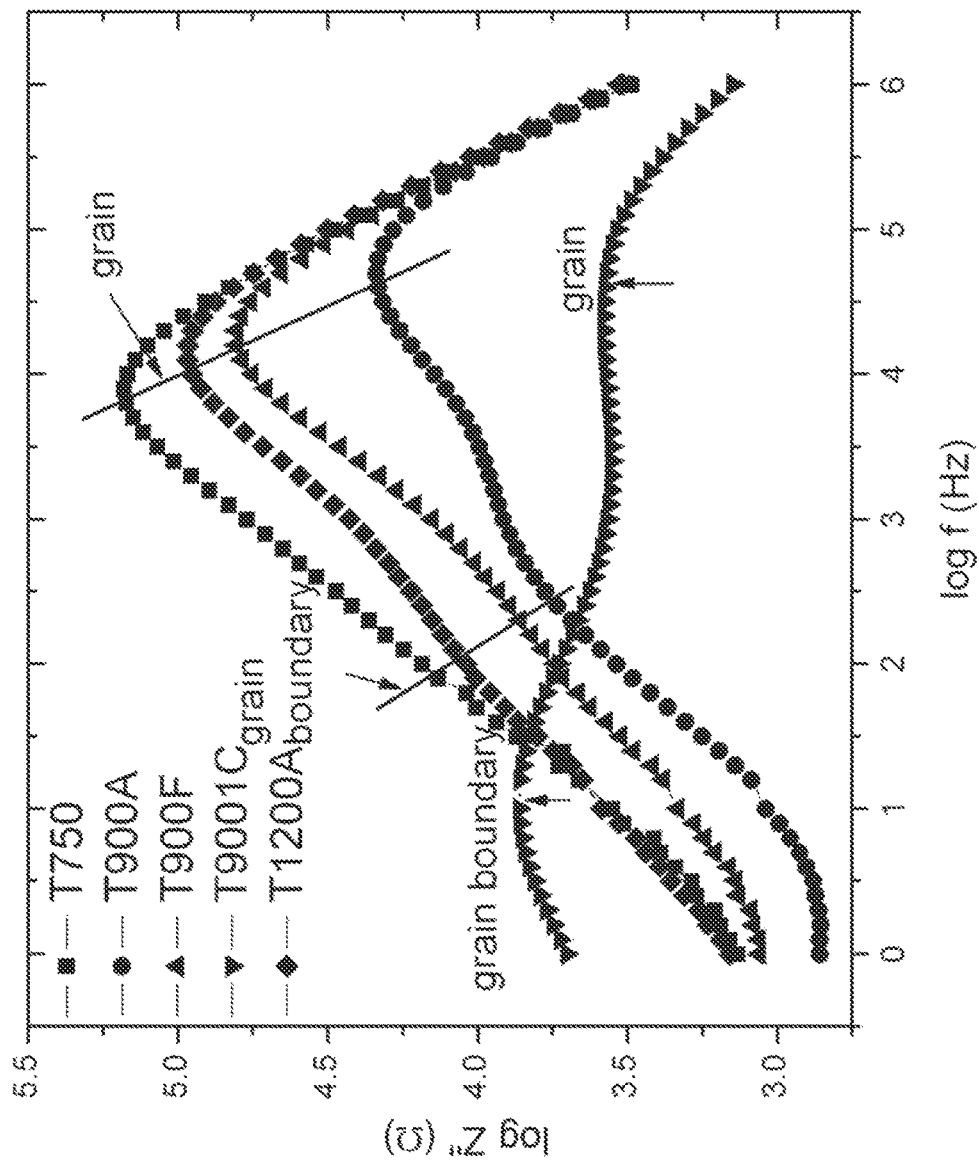
FIG. 12 is a plot showing the imaginary parts of impedance (Z") versus frequency.

By plotting the imaginary components of impedance, Z'', against frequency, as shown in FIG. 12, the responses of the grain and the grain boundary can be separated more clearly.

As Z" is dominated by the most resistive element, it can be seen that for samples T750, T900A, T900F, and T9001C, the high frequency grain response dominates the resistivity of the sample, while for sample T1200A, the low frequency grain boundary response dominates the resistivity of the sample.

The observation of a significant grain boundary response in T1200A is interesting. The total grain boundary resistivites, ($R_T$, $\Omega/m^3$), of T9001C and T1200A are very close to theoretical prediction. Since the difference in mean grain sizes (d, m) of these samples is about one order of magnitude, there is a corresponding order of magnitude difference in specific grain boundary resistivity ($R_s$, $\Omega/m^2$) according to the following equation:

$$R_T = \frac{R_s}{d} \quad (5)$$

In other words, the specific grain boundary resistivity has a reverse relation with the grain size. Since there is no direct evidence showing any physical and/or chemical changes in the grain boundary, it is expected that as grains start to grow into the microsize range and as the total grain boundary area decreases, the impurity concentration in the grain boundary will increase. Normally, the presence of impurities in the grain boundary increase the resistivity of the grain boundary, so the grain boundary response starts to become increasingly relevant as the grain size increases.

Likewise, when the effects of the grain boundary response starts to become significant, the high frequency semi-circle representing the grain response shrinks dramatically, suggesting that at a relatively high sintering temperature the impurities originally inside of the grains began to diffuse outside to the grain boundaries. As the grain boundary becomes the most resistive part in Sample T1200A, most of the electric field is confined to the grain boundary instead of the grain. Since the grain boundary is relatively thin as compared to the dimensions of the grain itself (typically less than about 1 nm as compared to a typically grain diameter of about 200 nm), the confinement of the electric field at the grain boundary gives rise to earlier breakdown and initiates the ultimate electric breakdown process. This notion is supported by I-V the curve of Sample T1200A, exhibiting the highest leakage current and non-linear behavior.

As noted above, the grain boundary is quite thin, with a typical thickness of less than 1 nm. The grains themselves are also unusually small (typically around 200 nm in diameter), thus the total surface area of the grains is unusually large. The grain boundary material is thus spread quite thinly over the grains, with a calculated volume of less than about 1.5% of the total volume of the sintered substrate. In such sintered nanoscale substrates having substantially elevated total grain surface area, the grain boundary phase must either be spread substantially thin or present in greater than usual proportion. If the latter, then the total amount of impurities present in the grain boundary phase would necessarily be diluted, resulting in a grain boundary phase having a substantially low concentration of impurities. Likewise, the oxygen stoichiometry and defect chemistry present in the grain boundary phase (as well as the grains themselves) may more prominently influence the electronic properties of the system as grain size and grain boundary thickness decrease.

Figure 13:
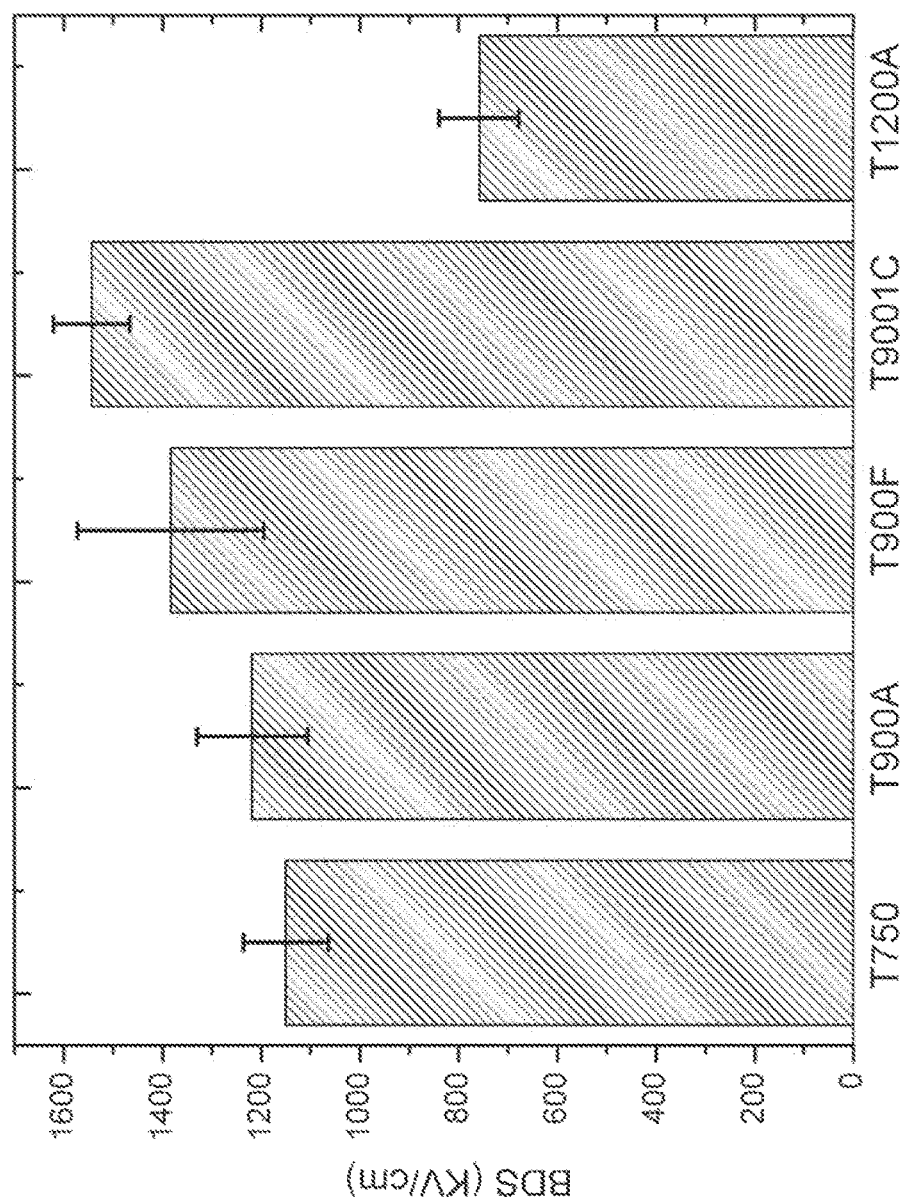
FIG. 13 is a plot illustrating dielectric breakdown strength of $TiO_2$ ceramics sintered in various conditions.

FIG. 13 plots the D.C. dielectric breakdown strength of each sintered sample. The BDS was measured on samples with dimpled configuration (as shown in FIG. 2), and, as a result, the maximum electric stress is located at the bottom of the dimple (i.e., the thinnest point). Consequently, the intrinsic BDS of a sintered sample was measured, as the edge effect (field concentration at electrode edge) was thus minimized or substantially eliminated.

Figure 14:
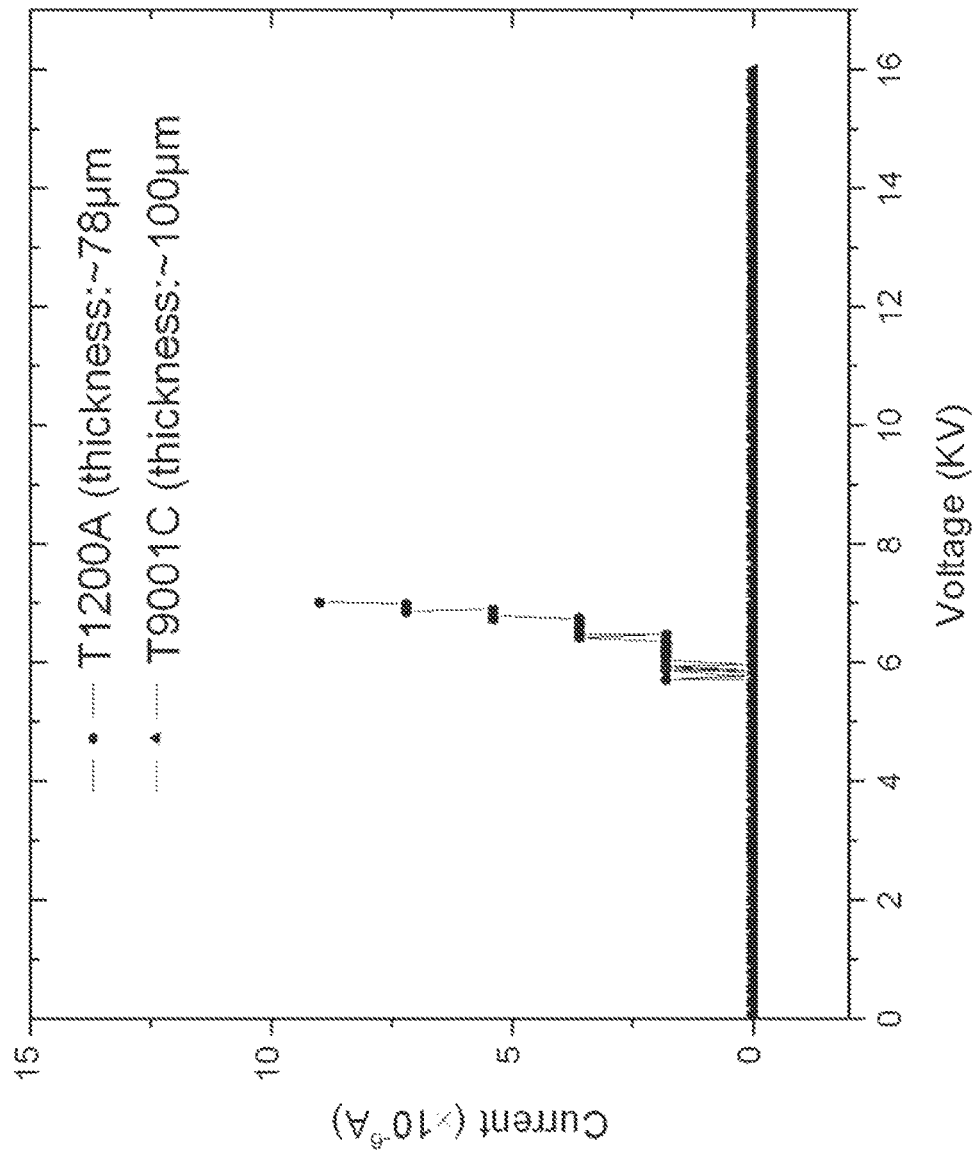
FIG. 14 is a plot illustrating the I-V curve during the breakdown strength test.

In FIG. 13, a reverse relationship between the BDS and the leakage current was observed, which indicates that the breakdown process is electronic in nature. Except for Sample T1200A, all the samples exhibited breakdown strengths higher than 1000 KV/cm. This behavior suggests that breakdown strength might have a grain size dependence, which is in agreement with previous researches on $BaTiO_3$ ceramics as well as $TiO_2$ ceramics. It has long been noticed that there is a correlation between breakdown strength and mechanical strength. Since refinement of the grain size reduces the critical flaw size which determines both mechanical strength and breakdown strength, fine gained samples are expected to have higher breakdown strength. However, in this case, sample T750 has the finest average grain size but does not exhibit the greatest breakdown strength; this observation may be due to sample T750's residual porosity. And for samples T900A, T900F, and T9001C, all of which were sintered at the same temperature with similar grain size and porosity, their differences in breakdown strength may more likely be explained by their electrical microstructures. Under optimized sintering conditions (FIG. 2 profile 1), the defects concentration was minimized and the leakage current was likewise reduced. Consequently, the most resistant sample also has the highest breakdown strength. Although Sample T1200A achieved almost 100% density, its breakdown strength is the lowest observed because its overall electrical resistance is the lowest. In addition, for Sample T1200A, voltage is mainly held by thin layer of the gain boundaries, so when critical filed stress is reached the grain boundary will start to fail, initiating the breakdown process. This postulate is supported by the phenomenon that during the breakdown strength test, almost no leakage current was detected for low temperature sintered samples until they failed, while for Sample T1200A a sharp increase of leakage current was observed before dielectric breakdown occurred (as shown in FIG. 14).

According to equation (2), the highest potential energy density about 15 $J/cm^3$ is achieved on sample T9001C, which is almost an entire order of magnitude higher than current paper based high energy density capacitors.

While the novel technology has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the novel technology are desired to be protected.

What is claimed is:

1. A method for producing a polycrystalline ceramic material, comprising:
    pressing a predetermined amount of substantially pure substantially fine precursor powder to yield a generally dense green body;

sintering the green body in an oxidizing atmosphere at sufficient firing temperature for sufficient soak time to yield a substantially densified sintered body; and cooling the substantially densified body at a substantially slow rate of about 3° C./min;

wherein the substantially densified sintered body has a maximum porosity of less than about 1 percent; and wherein the substantially densified sintered body has an average grain size of less than about 300 nm.

2. The method of claim 1 wherein the substantially densified sintered body has an average grain size of less than about 100 nm.

3. The method of claim 1 wherein the precursor powder is selected from the group including $TiO_2$, $BaTiO_3$, $Al_2O_3$, $ZrO_2$, lead zirconium titanate, and combinations thereof.

4. The method of claim 1 wherein the substantially slow rate is no greater than 1 degrees Celsius per minute.

5. The method of claim 1 wherein the substantially densified sintered body has a maximum porosity of less than about 0.1 percent.

6. The method of claim 1 wherein the substantially densified sintered body has a maximum porosity of less than about 0.01 percent.

7. The method of claim 1 wherein the average grain size is between about 150 nanometers and about 3 micrometers in diameter.

8. The method of claim 1 wherein the firing temperature is between about 750 degrees Celsius and about 1200 degrees Celsius and wherein the soak time is between about 120 minutes and about 850 minutes.

9. The method of claim 1 wherein the firing temperature is about 750 degrees Celsius and wherein the soak time is about 850 minutes.

10. The method of claim 1 wherein the firing temperature is about 1200 degrees Celsius and wherein the soak time is about 120 minutes.

11. A method for producing a dielectric substrate, comprising:

pressing substantially pure substantially fine precursor powder to yield a dense green body;

sintering the green body in an oxidizing atmosphere to yield a densified sintered body; and cooling the densified sintered body at a predetermined rate;

wherein the densified sintered body has a maximum porosity of less than about 1 percent; and wherein the substantially densified sintered body has an average grain size of less than about 200 nm.

12. The method of claim 11 wherein the densified sintered body has an average grain size of less than about 150 nm.

13. The method of claim 11 wherein the precursor powder is selected from the group including $TiO_2$, $BaTiO_3$, $Al_2O_3$, $ZrO_2$, lead zirconium titanate, and combinations thereof.

14. The method of claim 11 wherein the predetermined rate is no greater than 3 degrees Celsius per minute.

15. The method of claim 11 wherein the substantially slow rate is no greater than 1 degrees Celsius per minute.

16. The method of claim 11 wherein the densified sintered body has a maximum porosity of less than about 0.1 percent.

17. The method of claim 11 wherein the densified sintered body has a maximum porosity of less than about 0.01 percent.

18. The method of claim 11 wherein the average grain size is between about 150 nanometers and about 3 micrometers in diameter.

19. The method of claim 11 wherein the green body is sintered at a temperature between about 750 degrees Celsius and about 1200 degrees Celsius for a time between about 120 minutes and about 850 minutes.

20. The method of claim 19 wherein the temperature is about 750 degrees Celsius and wherein the time is about 850 minutes.

21. The method of claim 19 wherein the temperature is about 1200 degrees Celsius and wherein the time is about 120 minutes.

22. The method of claim 19 wherein the oxidizing atmosphere is oxygen.

23. A method for producing a dielectric substrate, comprising:

pressing a predetermined amount of substantially fine powder of predetermined composition to yield a green body;

sintering the green body in an oxidizing atmosphere at a firing temperature from about 750 degrees Celsius to about 1200 degrees Celsius for a time from about 120 minutes to about 850 minutes to yield a sintered body; and cooling the sintered body at a rate not greater than 1 degree Celsius per minute;

wherein the substantially densified sintered body has a maximum porosity of less than about 0.1 percent; and wherein the substantially densified sintered body has an average grain size of less than about 100 nm.

24. The method of claim 1 wherein the substantially slow cooling rate is about 1° C./min.

* * * * *